(12) United States Patent
Rose

(10) Patent No.: US 6,559,445 B2
(45) Date of Patent: May 6, 2003

(54) ELECTRON ENERGY FILTER WITH MAGNETIC DEFLECTING REGIONS

(76) Inventor: Harald Rose, Prinz-Christians-Weg 5 1/2, D-64287, Darmstadt (DE)

( * ) Notice: Subject to any disclaimer, the term of this patent is extended or adjusted under 35 U.S.C. 154(b) by 202 days.

(21) Appl. No.: 09/780,721

(22) Filed: Feb. 8, 2001

(65) Prior Publication Data

US 2002/0033455 A1 Mar. 21, 2002

(30) Foreign Application Priority Data

Feb. 8, 2000 (DE) .......................................... 100 05 347

(51) Int. Cl.⁷ ................................................ H01J 49/46
(52) U.S. Cl. .............................. 250/305; 250/396 ML; 250/311
(58) Field of Search ......................... 250/305, 396 ML, 250/311

(56) References Cited

U.S. PATENT DOCUMENTS

| | | | |
|---|---|---|---|
| 4,740,704 A | 4/1988 | Rose et al. | 250/396 ML |
| 4,760,261 A | 7/1988 | Rose et al. | 250/396 ML |
| 4,851,670 A | 7/1989 | Krivanek | 250/305 |
| 5,449,914 A | 9/1995 | Rose et al. | 250/396 ML |
| 5,811,801 A * | 9/1998 | Tsuno | 250/305 |
| 6,040,576 A * | 3/2000 | Benner | 250/305 |
| 6,384,412 B1 * | 5/2002 | Krahl et al. | 250/305 |

FOREIGN PATENT DOCUMENTS

DE 198 38 600 A1 8/1998 ............ H01J/49/46

* cited by examiner

*Primary Examiner*—Jack Berman

(57) ABSTRACT

The invention relates to an electron energy filter with magnetic deflection regions and a substantially W-shaped beam path. The energy filter has at least four magnetic deflection regions, that are respectively separated from each other by drift paths in the space free from magnetic fields. The whole filter is thus symmetrical with respect to a midplane (M). The total deflection angle in the first and last deflection region is at least 135°, and all the deflection regions together effect a deflection of the optical axis through an angle between 90° and 210°, preferably through 180°. The energy filter has a large Helmholtz length that is greater than double the average value of the deflection radii in the deflection regions.

39 Claims, 9 Drawing Sheets

ELECTRON ENERGY FILTER WITH MAGNETIC DEFLECTING REGIONS

BACKGROUND OF THE INVENTION

1. Technical Field

Imaging electron energy filters are used in transmission electron microscopes in order to improve the contrast of object imaging or of diffraction diagrams by the selection of electrons of a given energy range. The recording of element distributions and energy loss spectra is also possible with such filter systems.

2. Background Art

Filter systems are known from German Patent document U.S. Pat. No. 5,449,914, U.S. Pat. No. 4,740,704 and U.S. Pat. No. 4,760,261 which use three or four homogeneous or inhomogeneous magnetic fields as dispersive elements. These energy filters are straight-vision, i.e., the optical axes of the incident and emergent electron paths are mutually coaxial. These direct-vision energy filters have the advantage of relatively simple adjustability, since the whole imaging system before and after the energy filter can be pre-adjusted with the energy filter switched off. This advantage is however achieved at the expense of a relatively large constructional height of the whole system of electron microscope and energy filter, since all the electron-optical components are arranged in series along a straight optical axis. Mechanical stability problems can arise from this, particularly with electron energies of 200 keV and higher, and with the relatively large filters, arranged asymmetrically with respect to the symmetry axis of the electron-optical column, which are required for these energies.

Moreover, energy filters are known, for example from U.S. Pat. No. 4,851,670, which have a single deflecting region as dispersive element, effecting a beam deflection through 90°. A single dispersive element however produces relatively large imaging aberrations, because of which a quite expensive imaging system has to follow the deflecting element. The 90° deflection of the optical axis by the dispersive element, and the following horizontal course of the optical axis after the energy filter, admittedly reduce the constructional height. However, mechanical stability problems very easily arise with this system also, since the expensive optical imaging system after the energy filter leads to quite large moments under the influence of gravity.

Electron energy filters are furthermore known from German Patent document DE 198 38 600-A1 which likewise produce a 90° total deflection of the optical axis between the filter input and filter output, but which nevertheless have a symmetrical structure with respect to the midplane by means of multiple beam deflection in opposite directions. It is known that the symmetrical structure of the energy filter enables some imaging aberrations to be avoided within the energy filter, so that improved imaging properties result overall. However, here also, the horizontal course of the optical axis after the filter output leads to mechanical stability problems.

The present invention has as its object an energy filter, particularly for electron microscopes, which on the one hand makes possible a small constructional height of the whole system of electron microscope with energy filter, and on the other hand leads to as few mechanical stability problems as possible. A further object of the invention is to provide an energy filter in which the imaging aberrations which arise electron-optically can be kept as small as possible.

The first-mentioned object is attained according to the invention by means of an energy filter with magnetic deflection regions wherein all the deflection regions in common produce a total beam deflection through an angle between 90° and 210°, and the second-mentioned object is obtained by an energy filter with magnetic deflection regions which are arranged symmetrically with respect to midplane (M) and wherein the Helmholtz length of the energy filter is greater than double the average value of the deflection radii in the deflection regions. Advantageous embodiments of the invention will become apparent both from the combination of the two measures and also from the features of the dependent claims.

The electron energy filter according to the invention has several magnetic deflecting regions. All four deflecting regions in common produce a total deflection of between 90° and 120°.

Because the total deflection of the optical axis between the filter input and filter output is more than 90°, an optical axis running obliquely upward after the filter output results when the optical axis runs vertically downward before the filter input. The moments arising under the effect of gravity on the electron-optical components arranged after the filter output are reduced by this obliquely upward course of the optical axis after the filter output. An optimum mechanical stability is of course attained when the optical axis runs vertically again after the filter output, and the filter thus produces a total beam deflection of 180°, deviations of the course of the optical axis by ±30° from a vertical course having an only slight adverse effect on the mechanical stability. The limit of the maximum possible total deflection is given by the conditions that the detector following the energy filter must not be situated above the energy filter in the beam path of the electron microscope, and that the beam path emergent from the energy filter is also not to intersect the beam path entering the energy filter.

In order to keep the unavoidable electron-optical imaging aberrations of the energy filter small, besides maintaining mechanical stability, the energy filter is on the one hand to be constructed symmetrically with respect to a midplane, and at the same time the Helmholtz length is to correspond to at least twice, preferably at least three times or even five times, the average of the deflection radii in the deflection regions. The Helmholtz length is the distance between two planes, imaged to scale by the energy filter at a scale of 1:1, in or before the input-side region of the energy filter. One of these two input-side planes, the input diffraction plane, is then imaged dispersively at an imaging scale of 1:1 into the so-called dispersion plane, and the second of these two planes, the input image plane, is achromatically imaged at an imaging scale of 1:1 into the so-called output image plane.

A portion of the second order errors are known to disappear due to the symmetrical construction of the energy filter. By means of combination with a Helmholtz length which is long within the energy filter in comparison with the deflection radii—or with the average value of the deflection radii when the deflection radii are different—a small ray pencil diameter results within the energy filter, so that it is furthermore attained that the unavoidable higher order imaging aberrations remain small.

A Helmholtz length which corresponds to at least five times the deflection radius or of the average value of the deflection radii is then particularly suitable for electron microscopes with a monocular head before the energy filter—seen in the direction of electron propagation—since the Helmholtz length then corresponds approximately to the usual constructional length of the monocular head, i.e., the distance of the last projective lens before the monocular head and the fluorescent screen or detector.

A beam deflection through an angle greater than 135° preferably takes place in the first and last deflection regions. The energy filter has a very high dispersion because of the relatively long path lengths in the magnetic field associated with this.

It is furthermore advantageous if the first and last deflection regions respectively consist of two magnetic partial regions separated by a drift path, with the deflection angle in the first partial region after the filter input and in the last partial region before the filter output corresponding to the deflection angle of the two middle partial regions. At the same time, the drift path between the second partial region of the first deflection region and the second deflection region is to correspond to the drift path between the first and second partial regions of the first deflection region. The symmetry of the beam path in each of the two mutually symmetrical halves of the energy filter can thereby be further increased. The overall additional result is that there are beam paths close to the axis, and hence smaller errors of higher order.

In order to attain a maximum amount of symmetry, the two middle deflection regions are to be mutually separated by a drift path, the length of which corresponds to twice the distance between the input diffraction plane before the energy filter and the input edge of the first deflecting region. The energy filter then has a double symmetry, i.e., each of the two mutually symmetrical halves of the energy filter is itself furthermore symmetrical with respect to the midplane of the two halves, at least as concerns the focusing effect of the magnetic fields. Since the focusing produced by the magnetic fields is respectively quadratic with respect to the deflection produced by the magnetic field concerned, it is unimportant for the double symmetry of the energy filter that the two halves of the energy filter itself are themselves again symmetrical only up to a different sign of the deflection.

In order to attain an overall high dispersion and at the same time compact beam guiding, the deflection angle in each of the two partial regions of the first deflection region— and of course correspondingly also in the two partial regions of the last deflection region which are symmetrical thereto— is to be greater than or equal to 90°. The deflection angle in the first partial region of the first deflection region is then preferably even between 110° and 120°, ideally about 115°. The combination of a beam deflection of 115° in the first partial region and a deflection of 90° in the second partial region of the first deflection region then gives a maximum dispersion. A further increase of the deflection angle can only be realized with larger drift paths between the two partial regions of the first deflection region, since in other cases space problems arise between the second deflection region and the electron-optical components of the electron microscope.

In a particularly preferred embodiment, the energy filter is constituted as a whole as a telescopic or quasi-telescopic system. The energy filter is quasi-telescopic when the ratio of the objective focal length to the Helmholtz length about corresponds to the numerical aperture of the objective. This is attained when the Helmholtz length is greater than or equal to ten times the deflection radius or the average of the deflection radii. It has been found that the overall arising imaging aberrations can thereby be kept small, since the imaging aberrations of higher than second order remain small.

In order to completely correct the imaging aberrations of second order as a whole, it is advantageous to provide respective hexapoles in the drift paths between the individual deflection regions and partial regions; these are of course arranged mutually symmetrically in the two symmetrical halves of the energy filter. These hexapoles serve for the correction of the second order imaging aberrations.

In a portion of the deflection regions, the energy filter preferably has inhomogeneous magnetic fields.

The energy filter images an input-side plane, the input diffraction plane, dispersively into a freely accessible output-side plane, the dispersion plane or selection plane. A line focus, i.e., an image of the input diffraction plane focused in only one direction, thus arises in the symmetry plane of the energy filter.

Since the energy filter as a whole acts as a telescopic system, a real intermediate image of the object or of the source—according to whether an energy filtered object image or an object diffraction diagram is to be recorded—is to be produced in the focal plane, remote from the filter, of the last electron lens situated before the filter.

Particulars of the invention are described in detail hereinafter with the aid of the embodiment examples shown in the Figures.

DETAILED DESCRIPTION OF PREFERRED EMBODIMENTS

Figure 1:
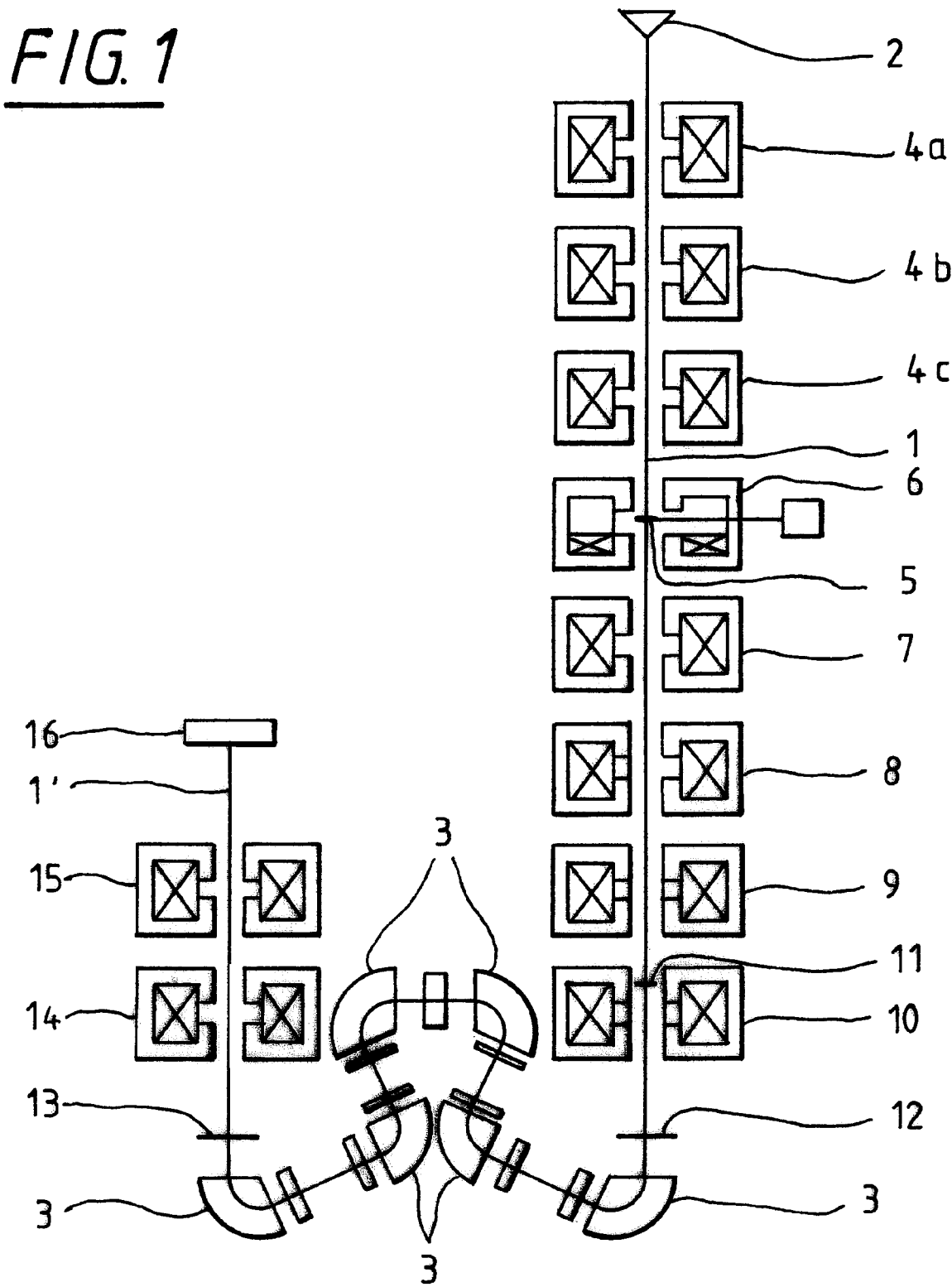
FIG. 1 shows a schematic illustration of an energy filter according to the invention in combination with a transmission electron microscope.

The transmission electron microscope shown in FIG. 1 has an overall course of the optical axis substantially corresponding to the line course of a capital letter J. In the portion connected before the energy filter (3)—seen in the beam direction—the electron-optical imaging system has an essentially conventional construction, with an electron source (2) and a multi-stage, preferably four-stage, condenser (4a, 4b, 4c, 6) consisting of three individual magnetic lenses (4a, 4b, 4c) and a condenser-objective single field lens (6) arranged after the three individual magnetic lenses (4a, 4b, 4c). A goniometer (5) to receive a specimen to be investigated is provided at the level of the pole shoe gap of the condenser-objective single field lens (6). The condenser-objective single field lens has a double function in this arrangement; it serves, in common with the three individual magnetic lenses arranged between the particle source (2) and the condenser-objective single field lens (6), on the one hand for the illumination of the specimen plane; and at the same time, as the objective for the enlarged imaging of the specimen plane.

The condenser-objective single field lens (6) is followed by a multistage imaging system, preferably consisting of four individual magnetic lenses (7, 8, 9, 10). This enlarging imaging system (7, 8, 9, 10) is then operated so that an image of the source (2), or more precisely of the crossover of the source (2), or the specimen plane, is imaged in the input diffraction plane (12) of the energy filter (3). The energy filter (3) images this input diffraction plane (12) dispersively stigmatically into the selection plane (13). Simultaneously, the electron-optical imaging system (7, 8, 9, 10) images at infinity either the crossover of the electron source (2) (for object diffraction diagrams) or the specimen plane (for energy-filtered object imaging). The last real intermediate image of the specimen in the case of the energy-filtered object imaging—or of the crossover of the particle source (2) in the case of taking object diffraction diagrams—before the energy filter (3) consequently arises in the focal plane (11), remote from the energy filter (3), of the last lens (10) of the electron-optical imaging system arranged before the energy filter (3). In other words, the excitation of the last lens (10) before the energy filter (3) is adjusted, according to the desired enlargement, so that according to the position of the last intermediate image, produced by the preceding enlarging imaging system of elements (7, 8, 9), coincides with the focal plane of the last lens (10) arranged before the energy filter (3).

The energy filter acts as an afocal electron-optical system, so that the parallel entering beams leave the energy filter (3) again parallel, i.e., the Helmholtz length of the energy filter is infinite. The energy filter (3) then deflects the optical axis through a total of 180°—besides additional further intermediate deflections within the energy filter (3)—so that the optical axis (1') emergent from the energy filter (3) is displaced parallel to the entering optical axis (1). The offset between the entering optical axis (1) and the emergent optical axis (1') is then preferably between about 0.6 m and 1 m.

Along the optical axis (1') running upward, again vertically, after the output of the energy filter (3), two further electron lenses (14, 15) are provided by means of which, selectively, either the parallel beams emergent from the energy filter (3) are imaged on the detector (16) in the case of energy-filtered object imaging, or the selection plane (13 is imaged on the detector (16) in the case of taking object diffraction diagrams. The detector (16) is constituted as a one-dimensional or two-dimensional electron detector, so that larger spectra can also be recorded.

Figure 2:
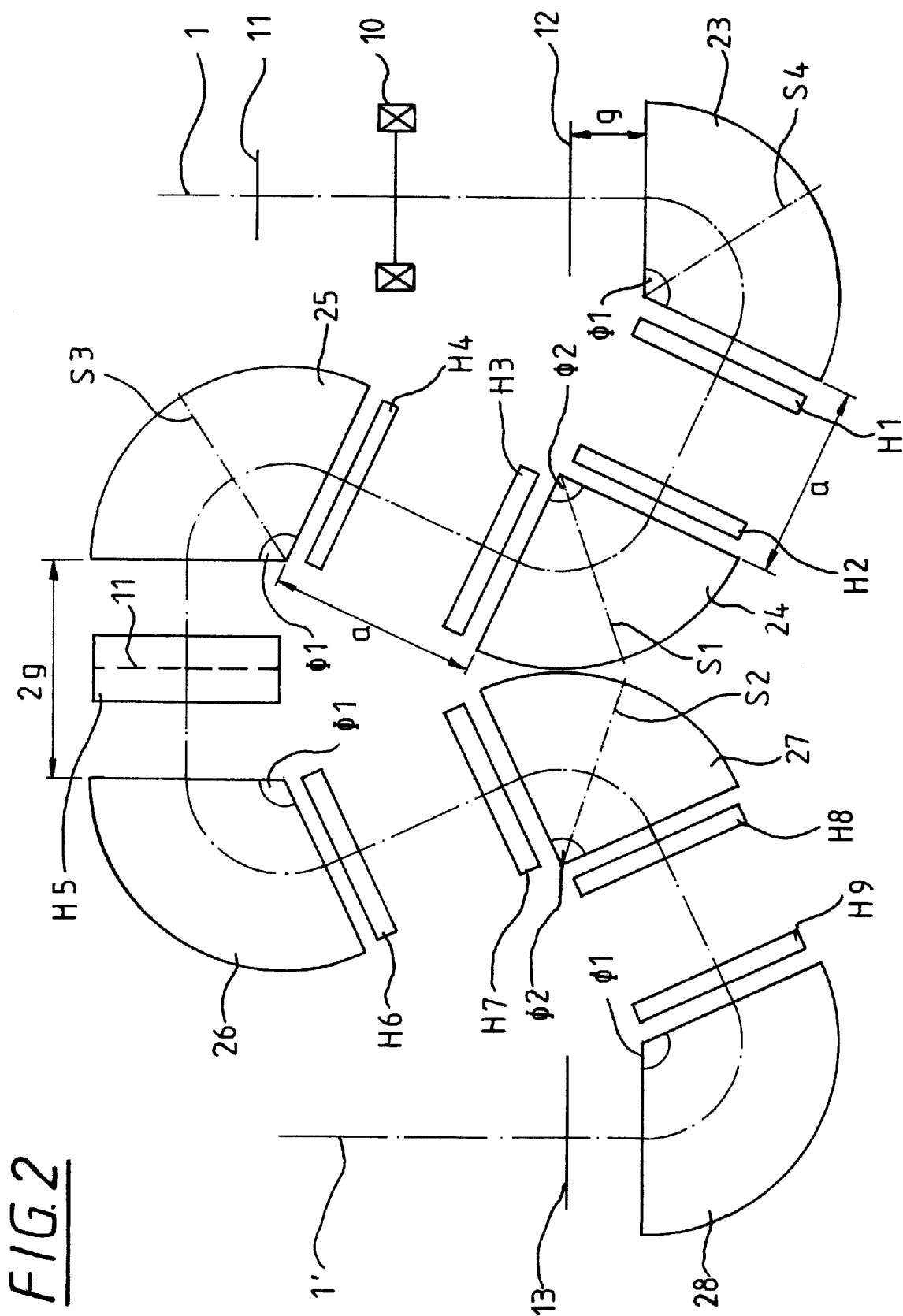
FIG. 2 shows an enlarged, schematic illustration of the energy filter of FIG. 1.

The structure of the energy filter (3) is shown in FIG. 2, again enlarged. The energy filter consists in total of six sector magnets (23, 24, 25, 26, 27, 28) which deflect the optical axis of the electron beam; the first two sector magnets (23, 24) of these form a first deflection region, the third sector magnet forms a second deflection region, the fourth sector magnet (26) forms a third deflection region, and the two last sector magnets (27, 28) form a fourth deflection region. The third and fourth deflection regions, consisting of the sector magnets (26, 27 and 28), are then arranged mirror-imagewise symmetrically of the two first deflection regions (23, 24, 25), so that the energy filter (3) has overall a structure which is symmetrical with respect to the midplane (M). In the case that only the aperture error in the selection plane (13) of the energy filter is to be corrected, the first and fourth deflection regions can respectively consist of a single sector magnet. So far as the correction of second order imaging aberrations in the image plane (16) is desired, it is however advantageous to provide the first deflection region, as shown in FIG. 2, in two partial regions (23, 24) with respectively separate sector magnets and a drift path situated between them in the space free from magnetic fields. In the latter case, because of the symmetry of the energy filter, a corresponding division of the fourth and last deflection region into two sector magnets (27, 28) is of course also to be provided.

Two hexapole sectors (H1 and H2) are provided in the drift path between the two partial regions of the first deflection region, and two further hexapole sectors (H3 and H4) are provided in the drift path between the second partial region of the first deflection region and the second deflection region. These hexapole correctors serve for the correction of second order imaging aberrations in the final image plane (16). Because of the symmetry with respect to the midplane (M), two further hexapole correctors (H6, H7) are correspondingly provided between the third deflection region (26) and the first partial region of the last deflection region (27), and two further hexapole correctors (H8, H9) are provided between the two partial regions of the last deflection region. A further hexapole corrector (H5) is arranged in the midplane (M) between the second deflection region (25) and the third deflection region (26).

The drift path between the exit from the second partial region of the first deflection region and the entry of the electron beam into the second deflection region (25) is identical, in FIG. 2, to the drift path between the two partial regions (23, 24) of the first deflecting region. Furthermore, at the same time the deflection angle $\Phi 1$ in the first partial region (23) of the first deflection region and in the second deflection region (25) is chosen to be identical. These two measures give a further symmetrization. The structure of the energy filter between the midplane (S3) standing perpendicular to the optical axis in the second deflection region (25) and the midplane (S4) standing perpendicular to the optical axis in the first partial region (23) of the first deflection region is thus mirror-wise symmetrical to the midplane (S1) standing perpendicular to the optical axis in the second partial region (24) of the first deflection region. Because of the symmetry of the whole filter (M), an analogous partial symmetry of course results relative to the midplane (S2), standing perpendicular to the optical axis, of the first partial region of the last deflection region. The path sections remaining in each half of the energy filter, between the input diffraction plane and the midplane (S4) of the first partial region of the first deflection region and also between the midplane (S3) of the second deflection region and the midplane (M) differ solely in the directions of deflection, but not in the strength of the deflection. Since the focusing produced by the magnetic fields is quadratic in the deflection and thus independent of the direction of deflection, there thus results for the overall path courses in the first half of the energy filter an additional symmetry with respect to the midplane (S1) of the second partial region of the first deflection region, and in the second half a symmetry with respect to the midplane (S2) of the first partial region of the fourth deflection region. The energy filter is thus doubly symmetrical, up to a difference in the directions of deflection. The effect of this additional partial symmetry, together with the large Helmholtz length, is that all the electron paths run relatively near the axis, and hence higher order errors remain small.

Without the hexapole correctors (H1–H8), the sign and the second order aperture errors in the selection plane (13) in FIG. 1 would be corrected in the energy filter shown in FIG. 2. All the errors, including second order errors, can be corrected both in the achromatic image plane and also in the selection plane (13) by means of the additional hexapole correctors (H1–H8).

To maintain symmetry, the distance between the second deflection region (25) and the third deflection region (26)

has twice the distance which the input diffraction plane (12) has from the entry edge of the first deflection region (23).

A preferred embodiment example of an energy filter according to FIG. 2 has the following constructional data:

κ1=0.7906
κ2=0.7929
μ1=0.6123
μ2=0.6094
g=0.5809 R
a=1.736 R
D=7.296 R/E0
s=1.32 R
A=8.46 R.

Here κ1 is the normed dimensionless magnetic focusing strength, perpendicular to the plane of the drawing in FIG. 2, of the first, third, fourth and sixth sector magnets (23, 24, 25, 26 and 28); μ1 is the normed dimensionless magnetic focusing strength, perpendicular to the plane of the drawing in FIG. 2, of the second and fourth sector magnets (24, 27); κ2 is the normed dimensionless magnetic focusing strength, in the plane of the drawing in FIG. 2, of the first, third, fourth and sixth sector magnets (23, 25, 26 and 28); μ2 is the normed dimensionless magnetic focusing strength, in the plane of the drawing in FIG. 2, of the second and fourth sector magnets (24, 27); g is the distance between the dispersive plane (13) and the exit edge of the last sector magnet (28), or between the input diffraction plane (12) and the entry edge of the first sector magnet (23); a is the free drift path between the two partial regions of the first deflection region (23, 24) and between the second partial region of the first deflection region and the second deflection region (25); D is the dispersion; s is the minimum distance between the optical axes in the second sector magnet (24) and the fourth sector magnet (27); and A is the axial distance of the two optical axes (1, 1') before entry into, and after exit from, the energy filter. R is the deflection radius of the optical axis, and is identical in all the sector magnets; and E0 is the energy of the electrons which are propagated on the optical axis in the energy filter. In the embodiment example shown in FIG. 2, the deflection angle Φ1 in the first and third sector magnets (23, 25) is respectively 115°, and in the second sector magnet (24), 90°.

The normed dimensionless quadrupole strengths κi and μi are defined here by the relationships:

$$\kappa i^2 = \sqrt{\frac{2e}{mU}} |\Psi_2| R^2, \mu i^2 = 1 - \kappa i^2$$

In these two relationships, R is the respective radius of curvature of the optical axis within the deflecting magnets, U is the electron accelerating voltage, e is the elementary charge and m the electron mass. The magnetic quadrupole strength $$\Psi_2 = -\frac{\partial B}{\partial y}\bigg|_{y=0}$$

is then the gradient of the magnetic flux density perpendicular to the midplane, taken along the optical axis.

The focusing strengths κ1, κ2 and μ1, μ2 can be attained in two different ways, either by inhomogeneous magnetic fields, as in U.S. Pat. No. 5,449,914 or as described in the article by H. Rose, D. Krahl, "Electron Optics of Imaging Energy Filters" in Springer Series in Optical Science, Vol. 71, pp, 57 ff., Springer Verlag 1995, or else by suitable choice of the inclination of the entry and exit edges of the sector magnets (23–38) to the optical axis as described, for example, in Optik, Vol. 54, No. 3, pp. 235–250.

In the embodiment described in FIG. 2, in which all the entry and exit edges of the sector magnets stand perpendicular to the optical axis, or the optical axis always stands locally perpendicular to the entry and exit edges of the respective sector magnet, the first sector magnet (23) of the first deflection region and both middle sector magnets (25, 26) and the last sector magnet (28) of the last deflection region are constituted conically, corresponding to U.S. Pat. No. 5,449,914.

Figure 3A:
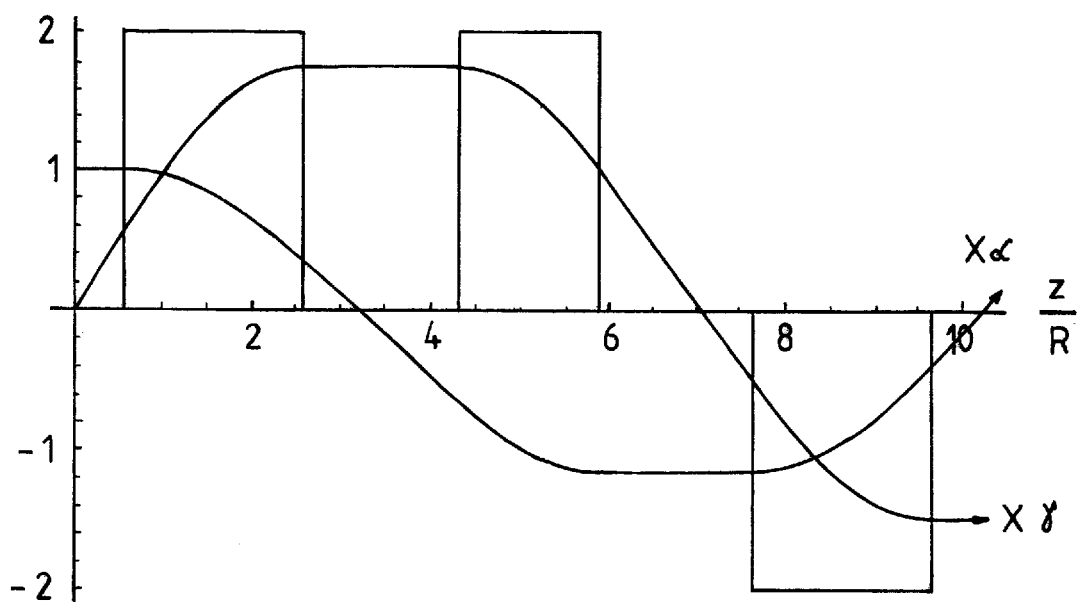
FIGS. 3a and 3b show the fundamental paths within the energy filter of FIG. 2 in the plane of the drawing of FIG. 2 (FIG. 3a) and in the plane perpendicular to the plane of the drawing of FIG. 2 (FIG. 3b)
Figure 3B:
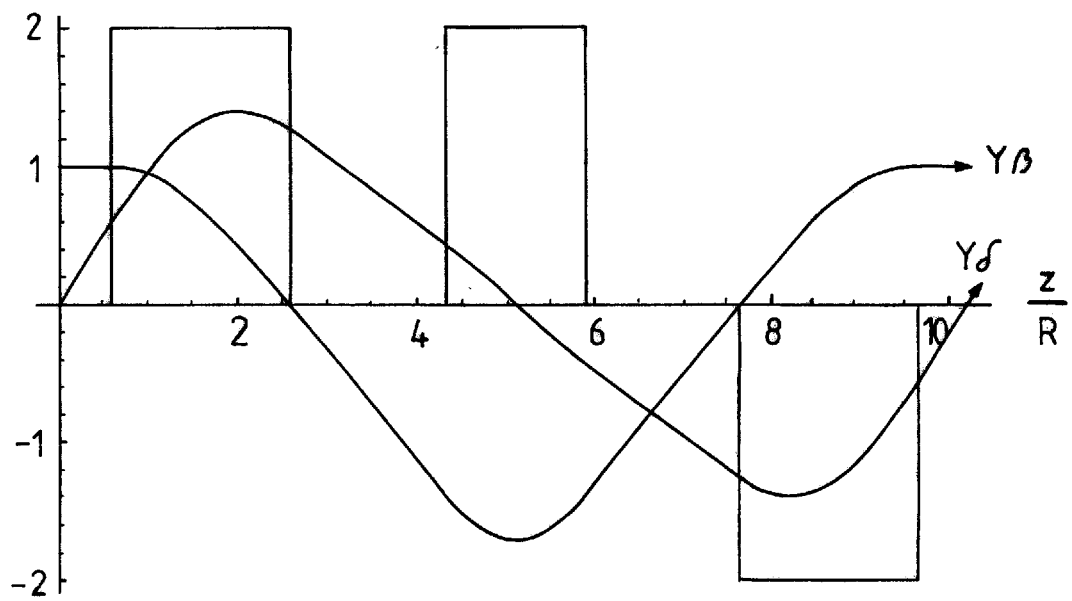
Figure 3C:
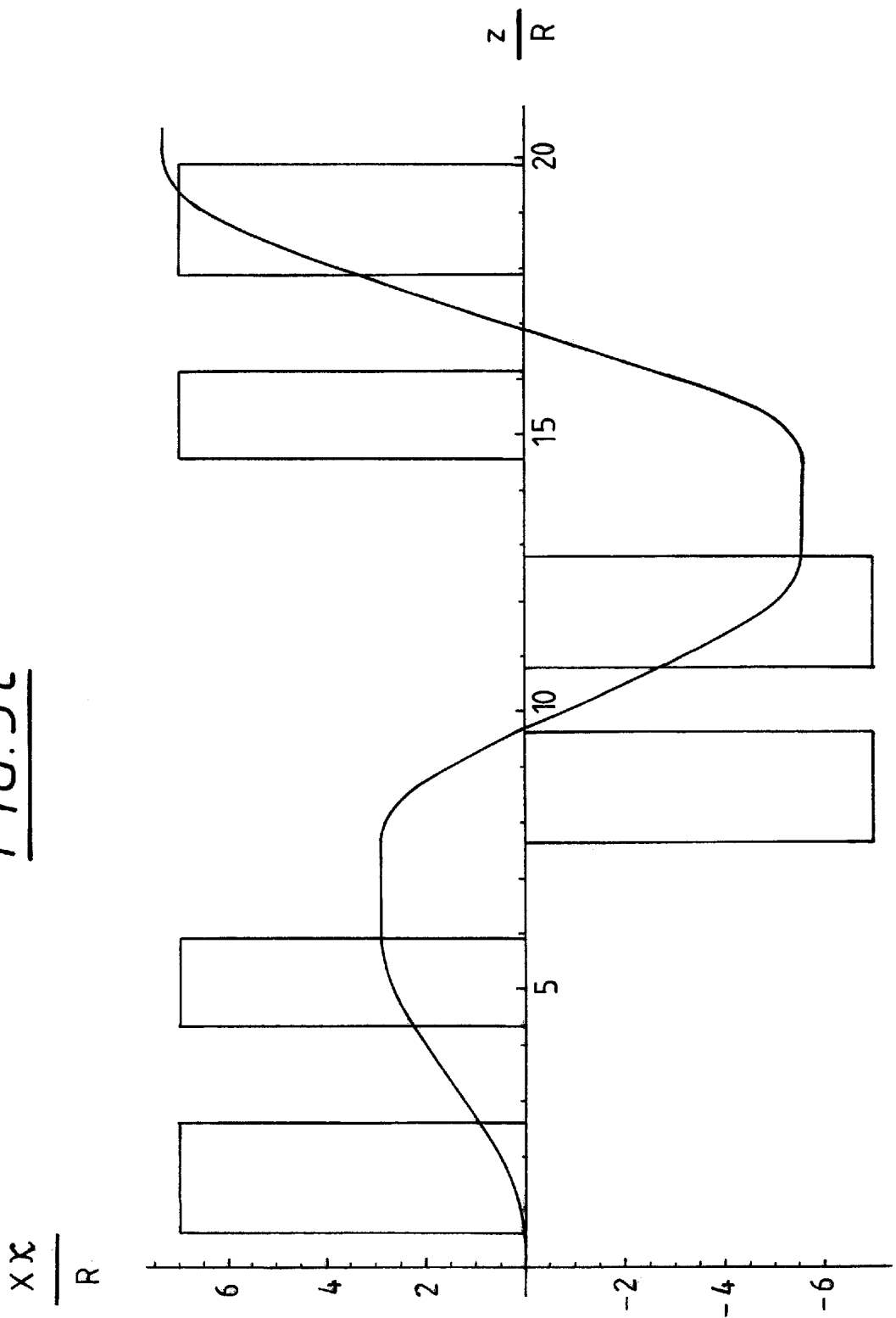
FIG. 3c shows the dispersive path in the energy filter of FIG. 2.

The fundamental paths through an energy filter according to FIG. 2 with the constructional data given hereinabove in the first half of the energy filter, thus between the input diffraction plane (12) and the midplane (M), are shown in FIGS. 3a and 3b for 200 keV electrons. The further course of the fundamental paths through the second half of the energy filter as far as the dispersion plane (13) results from a corresponding mirror image of the course of the fundamental paths in the first half of the energy filter. As will be apparent from the fundamental paths in FIGS. 3a and 3b, two line foci arise in the midplane (M), namely both a line focus of the input diffraction plane (12) and also a line focus of the input image plane (11). The line focus of the input diffraction plane in the midplane is then situated with the line direction in the plane containing the optical axis; on the other hand, the line focus of the input image plane is situated with the line direction perpendicular to the plane containing the optical axis. A further line focus of the input diffraction plane perpendicular to the x-z-section, and thus with the line direction perpendicular to the plane containing the optical axis, arises between the first and second deflection regions. The energy filter has a dispersion of 3.3 μm per eV when the primary electron energy is E0=200 keV and the axial distance (A) between the entry-side optical axis (1) and the exit-side optical axis (1') is 0.6 m.

Figure 4:
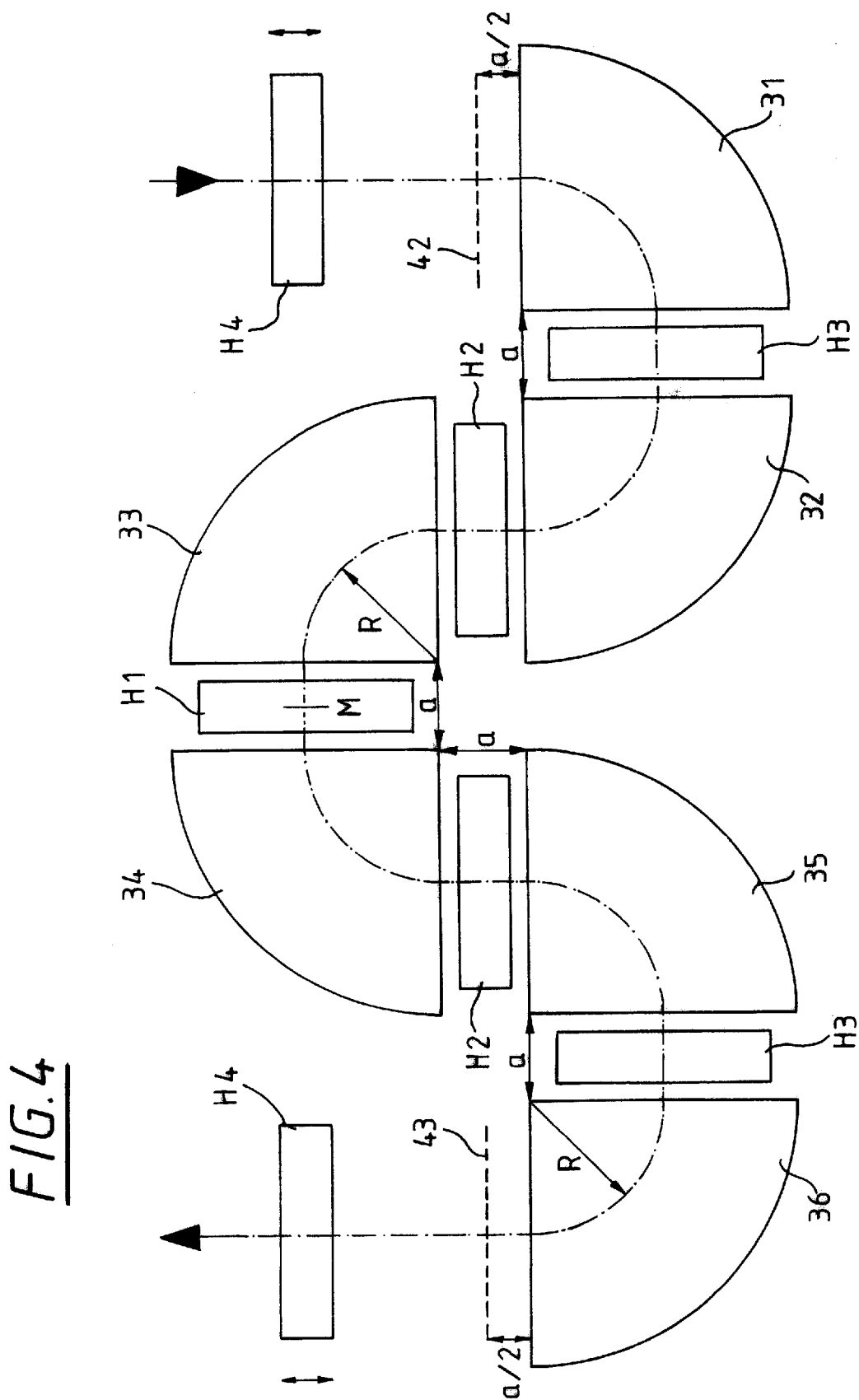
FIG. 4 shows a schematic illustration of a further embodiment example of an energy filter according to the invention.

A second embodiment example of the invention is shown in FIG. 4, and consists of six sector magnets (31–36) which respectively produce a beam deflection of 90°. Here also, the energy filter is constructed symmetrically with respect to the midplane (M). The two first sector magnets (31, 32) and the two last sector magnets (35, 36) also again form a common deflection region here, which effects a total deflection of 180°. The sum of all six sector magnets (31–36) produces a total deflection of the optical axis by 180° between the input side of the energy filter and the output side of the energy filter. The length of the drift paths (a) between two respective deflection regions is identical in this embodiment example, and is equal to twice the distance of the distance of the dispersion plane (43) from the exit edge of the last sector magnet (36) or the distance between the input diffraction plane (42) and the entry edge of the first sector magnet (31). Respective hexapole correctors (H1–H3), which serve for the correction of second order errors in the image, are provided in this embodiment example also. Additionally, further hexapole correctors (H4) are provided before the entry edge of the first sector magnet (31) and after the exit edge of the last sector magnet (36).

The energy filter shown in FIG. 4 is also doubly symmetrical, i.e., each of the two symmetrical halves is furthermore—up to a difference of deflection directions—constructed symmetrically of the midplanes, standing perpendicular to the optical axis, of the second sector magnet (32) or of the fifth sector magnet (35).

Such an energy filter can have the following constructional data:

Magnetic focusing strength of the sector magnets perpendicular to the plane of the drawing (yz-section): κ=0.5573;

Magnetic focusing strength of the sector magnets in the plane of the drawing (xz-section): μ=0.8303;

Dispersion D=4.351 R/E0;

Free drift path between the sector magnets a=0.6577 R.

Here R is again the deflection radius for the optical axis, and is again identical in all six sector magnets. Such an energy filter, for a distance A=8R=0.6 m between the entry-side optical axis and the exit-side optical axis, has a dispersion of 1.95 μm per eV at an electron energy of E0=200 keV.

In the embodiment example shown in FIG. 4, in which the optical axis, respectively at the entry and exit edges of the individual sector magnets (31–36), runs perpendicularly of the entry and exit edges, the magnetic focusing strengths are again produced by corresponding inhomogeneous magnetic fields.

Figure 5A:
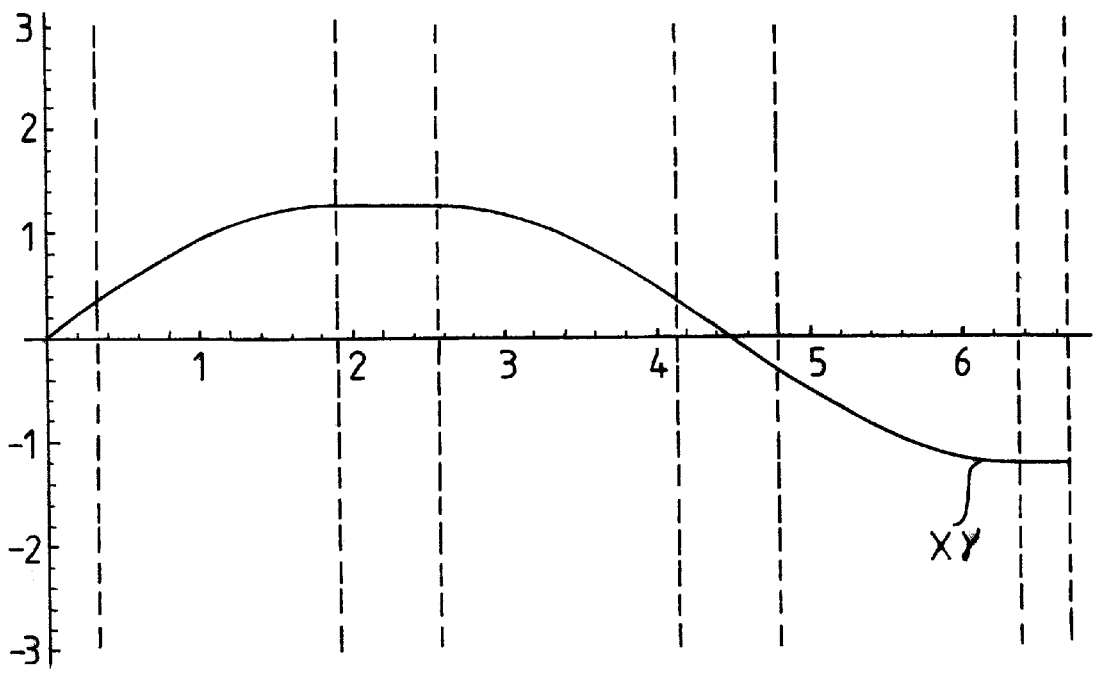
FIGS. 5a–5e show the fundamental paths in the energy filter according to FIG. 4.
Figure 5B:
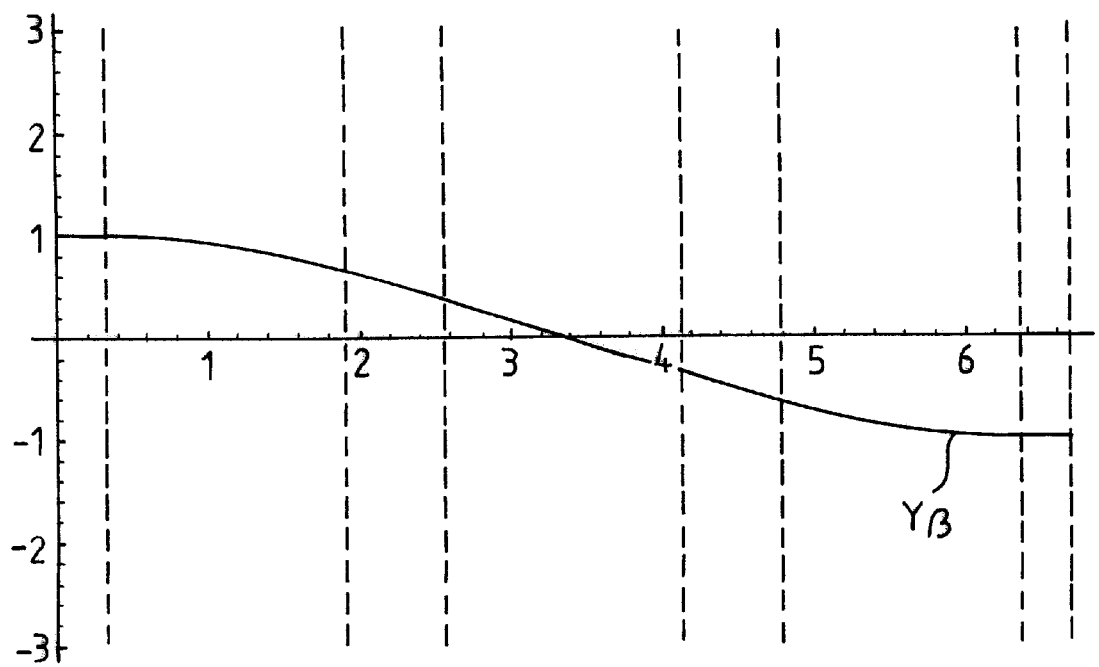
Figure 5C:
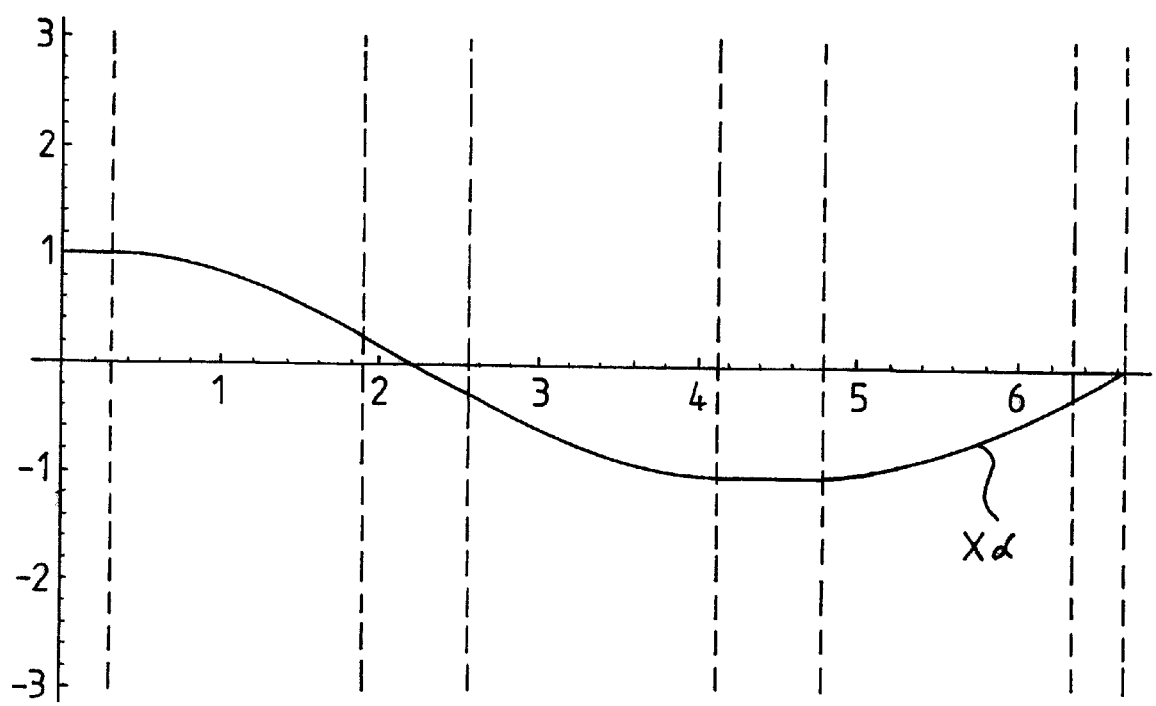
Figure 5D:
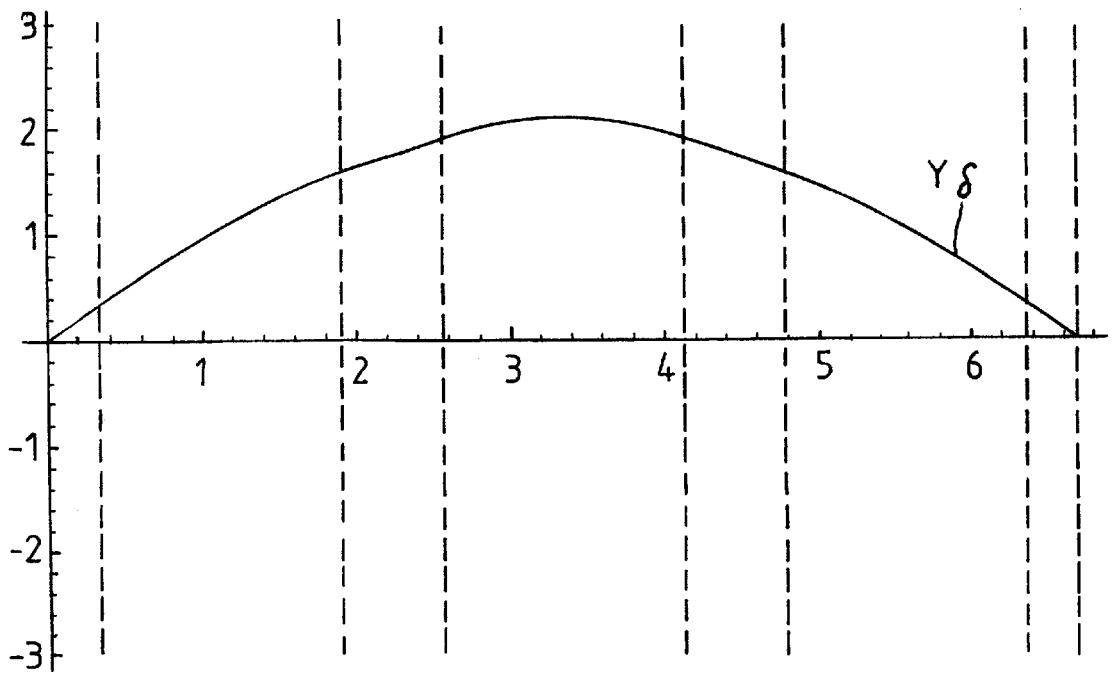
Figure 5E:
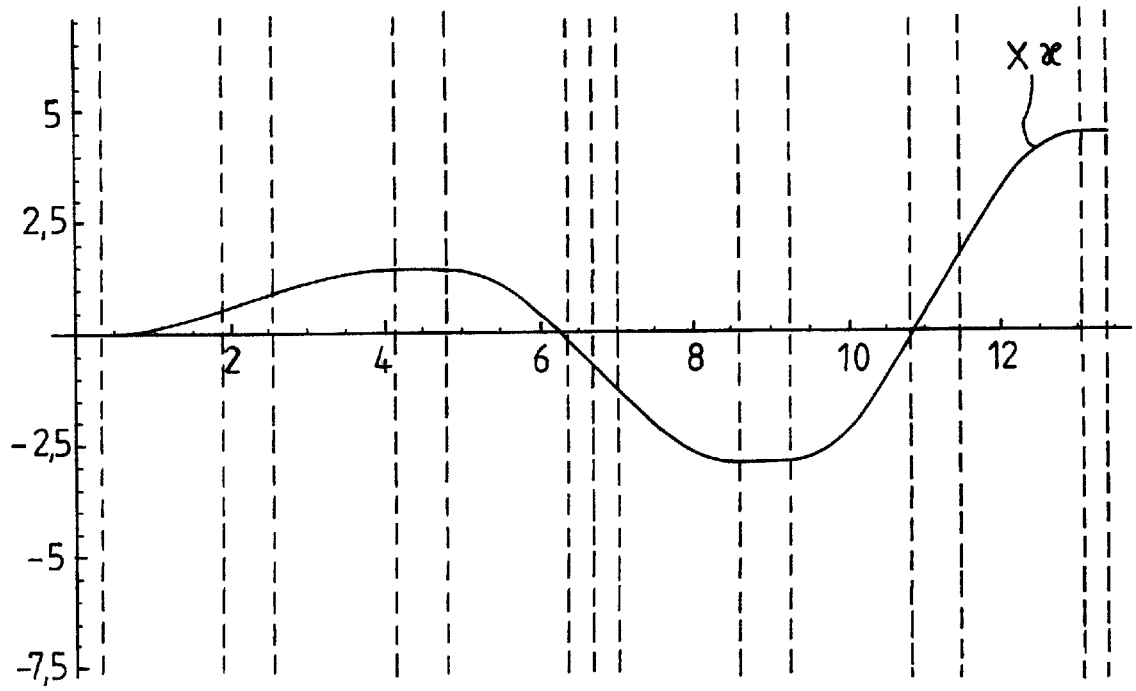

The courses of the fundamental paths, respectively in the first half of the energy filter, and thus between the input diffraction plane (42) and the midplane (M), are shown in FIGS. 5a–5d. The dispersive path xκ is shown in FIG. 5e. As will become apparent here from the fundamental paths, in this energy filter also, two line foci arise in the midplane, namely a line focus of the image plane and a further line focus of the input diffraction plane.

Figure 6:
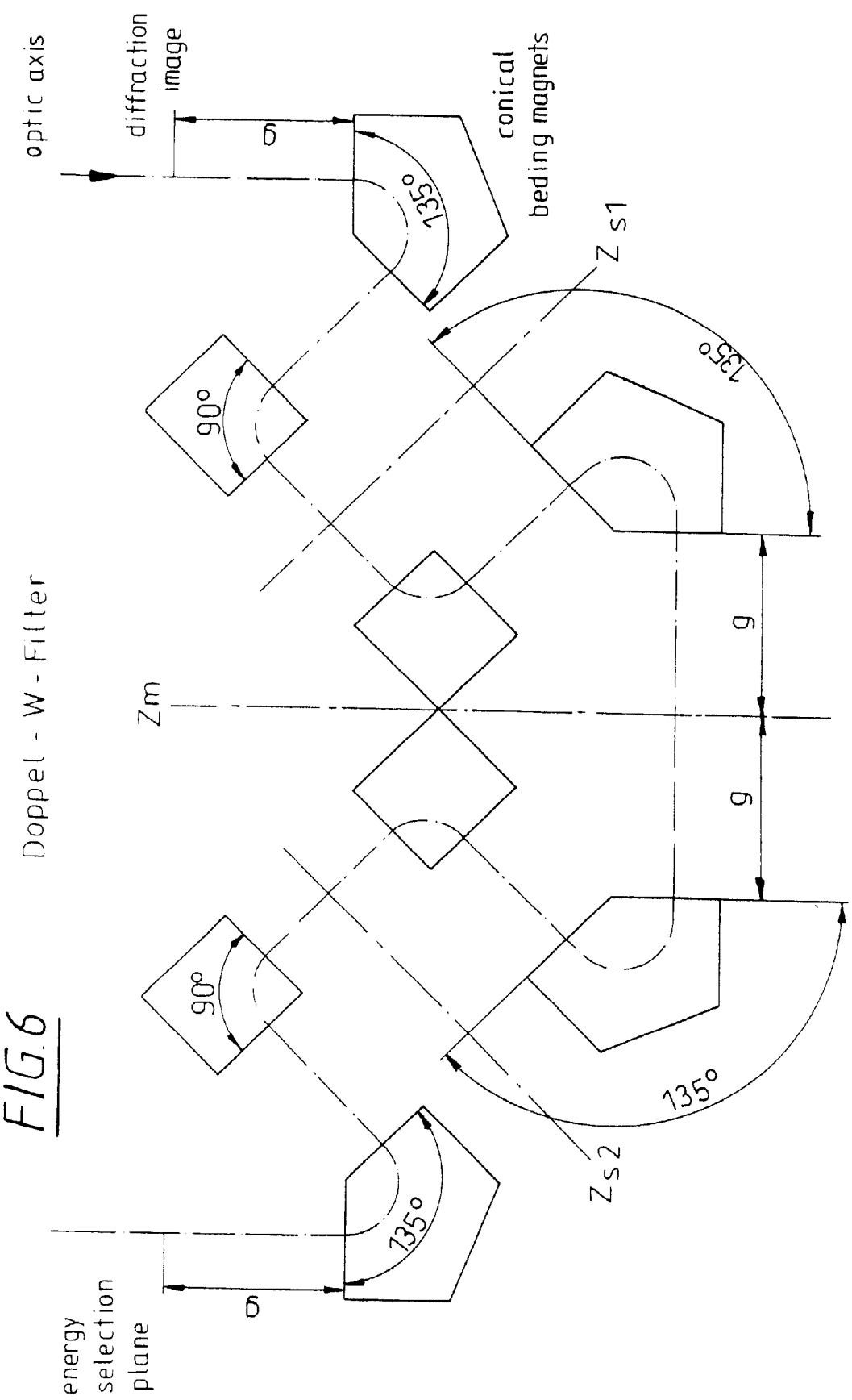
FIG. 6 shows a section through an energy filter with eight deflection regions and complete double symmetry.

The energy filter shown in FIG. 6 has a total of eight sector magnets, of which, seen in the beam direction, the first, fourth, fifth and eighth sector magnets respectively effect a deflection through 135° and the remaining sector magnets respectively effect a deflection through 90°. The total deflection of the optical axis is also 180° in this example. The energy filter is symmetrical with respect to a midplane (Zm) and each of the two mutually symmetrical halves is constructed symmetrically of a respective symmetry plane (Zs1, Zs2), so that this energy filter also has a double symmetry. It basically consists of two energy filters connected in series, each of which effects a deflection of the optical axis through 90°.

The Helmholtz length is infinite for the embodiment examples described using FIGS. 2 and 4. The results intended for the invention can however be attained more satisfactorily when shorter Helmholtz lengths are realized, as long as these are still sufficiently long in comparison with the deflection radii.

In the two embodiment examples described using the Figures, the deflection radii in all sector magnets are respectively identical. It is however also possible to choose different deflection radii while retaining the double symmetry. For example, the double symmetry is also retained when the deflection radii in the embodiment example in FIG. 2 are equal in the second partial region (24) of the first deflection region and in the first partial region of the third deflection region (27), but differ from the deflection radii in the remaining deflection regions (25, 26) and partial regions (23, 28).

The energy filter according to the invention preferably finds application as a so-called "In-Column-Filter", which is integrated into the column of the electron microscope and has a post-enlargement after the energy filter by a factor of at least 100×. The use is however also conceivable as a so-called "Post-Column-Filter", with only a weak post-enlargement after the output of the energy filter.

I claim:

1. An electron energy filter comprising a plurality of magnetic deflection regions wherein all said deflection regions in common produce a total beam deflection through an angle between 90° and 210°.

2. The electron energy filter according to claim 1, wherein at least four said deflection regions are provided, and a drift path is provided in space free from magnetic fields between two middle deflection regions.

3. The electron energy filter according to claim 2, wherein said drift path between said two middle deflection regions corresponds to double the distance between an input-side diffraction plane and an entry edge of a first deflection region (23).

4. The electron energy filter according to claim 3, wherein said first deflection region and a last deflection region respectively comprise two partial regions with a drift path situated between them in a space free from magnetic fields.

5. The electron energy filter according to claim 4, wherein the deflection angle Φ1 of said first partial region of said first deflection region is equal to the deflection angle Φ1 of said two middle deflection regions.

6. The electron energy filter according to claim 2, wherein the length of the drift path between two partial regions of said first deflection region is equal to the length of the drift path between an exit from said first deflection region and an entry into a second deflection region.

7. The electron energy filter according to claim 2, wherein the deflection angle of each of two partial regions of said first deflection region is greater than or equal to 90°.

8. The electron energy filter according to claim 7, wherein said deflection angle of said first partial region of said first deflection region has a value between 110° and 120°.

9. The electron energy filter according to claim 8, wherein said deflection angle of said first partial region is 115°.

10. The electron energy filter according to claim 2, further comprising hexapole correctors arranged between said deflection regions.

11. The electron energy filter according to claim 1, wherein the filter comprises an afocal telescopic system.

12. The electron energy filter according to claim 1, wherein a portion of said deflection regions comprises inhomogeneous magnetic fields.

13. The electron energy filter according to claim 1, wherein the total deflection of the optical axis between an entry into the energy filter and an exit from the energy filter is between 150° and 210°.

14. The electron energy filter according to claim 13, wherein said total deflection is 180°.

15. The electron energy filter according to claim 1, wherein the distance between the optical axis at an input of said energy filter and the optical axis at an output of the energy filter, perpendicular to the optical axis at said input of the energy filter, is at least 0.6 m.

16. An electron microscope comprising an energy filter according to claim 1.

17. The electron microscope according to claim 16, wherein a real intermediate image of the object or the source is produced in a focal plane, remote from the filter, of a last electron lens preceding the filter.

18. The electron energy filter according to claim 1, wherein the energy filter is telescopic or quasi-telescopic.

19. An electron energy filter comprising a plurality of magnetic deflection regions arranged symmetrically with respect to a midplane (M), wherein the Helmholtz length of the energy filter is greater than double the average value of the deflection radii in said deflection regions.

20. The electron energy filter according to claim 19, wherein the Helmholtz length of the energy filter is greater than three times the average value of the deflection radii in the deflection regions.

21. The electron energy filter according to claim 20, wherein the Helmholtz length of the energy filter is greater than five times the average value of the deflecting radii in the deflection regions.

22. The electron energy filter according to claim 20, wherein the energy filter is telescopic or quasi-telescopic.

23. The electron energy filter according to claim 19, wherein all said deflection regions in common produce a total beam deflection through an angle between 90° and 210°.

24. The electron energy filter according to claim 19, wherein at least four said deflection regions are provided, and a drift path is provided in space free from magnetic fields between two middle deflection regions.

25. The electron energy filter according to claim 24, wherein said drift path between said two middle deflection regions corresponds to double the distance between an input-side diffraction plane and an entry edge of a first deflection region (23).

26. The electron energy filter according to claim 25, wherein said first deflection region and a last deflection region respectively comprise two partial regions with a drift path situated between them in a space free from magnetic fields.

27. The electron energy filter according io claim 26, wherein the deflection angle $\Phi 1$ of said first partial region of said first deflection region is equal to the deflection angle $\Phi 1$ of said two middle deflection regions.

28. The electron energy filter according to claim 24, wherein the length of the drift path between two partial regions of said first deflection region is equal to the length of the drift path between an exit from said first deflection region and an entry into a second deflection region.

29. The electron energy filter according to claim 24, wherein the deflection angle of each of two partial regions of said first deflection region is greater than or equal to 90°.

30. The electron energy filter according to claim 29, wherein said deflection angle of said first partial region of said first deflection region has a value between 110° and 120°.

31. The electron energy filter according to claim 30, wherein said deflection angle of said first partial region is 115°.

32. The electron energy filter according to claim 24, further comprising hexapole correctors arranged between said deflection regions.

33. The electron energy filter according to claim 19, wherein the filter comprises an afocal telescopic system.

34. The electron energy filter according to claim 19, wherein a portion of said deflection regions comprises inhomogeneous magnetic fields.

35. The electron energy filter according to claim 19, wherein the total deflection of the optical axis between an entry into the energy filter and an exit from the energy filter is between 150° and 210°.

36. The electron energy filter according to claim 35, wherein said total deflection is 180°.

37. The electron energy filter according to claim 19, wherein the distance between the optical axis at an input of said energy filter and the optical axis at an output of the energy filter, perpendicular to the optical axis at said input of the energy filter, is at least 0.6 m.

38. An electron microscope comprising an energy filter according to claim 19.

39. The electron microscope according to claim 38, wherein a real intermediate image of the object or the source is produced in a focal plane, remote from the filter, of a last electron lens preceding the filter.

* * * * *